United States Patent
Araki et al.

(10) Patent No.: US 11,920,240 B2
(45) Date of Patent: Mar. 5, 2024

(54) SUBSTRATE PROCESSING APPARATUS, STATE DETERMINATION METHOD AND COMPUTER-READABLE RECORDING MEDIUM

(71) Applicant: Tokyo Electron Limited, Tokyo (JP)

(72) Inventors: Ryo Araki, Koshi (JP); Junnosuke Maki, Koshi (JP); Mitsuteru Yano, Koshi (JP); Masato Hayashi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/498,886

(22) Filed: Oct. 12, 2021

(65) Prior Publication Data
US 2022/0112601 A1     Apr. 14, 2022

(30) Foreign Application Priority Data
Oct. 14, 2020   (JP) .................................. 2020-173154

(51) Int. Cl.
C23C 16/455   (2006.01)
B05B 12/00    (2018.01)
C23C 16/46    (2006.01)

(52) U.S. Cl.
CPC ...... *C23C 16/45563* (2013.01); *B05B 12/004* (2013.01); *C23C 16/45557* (2013.01); *C23C 16/463* (2013.01)

(58) Field of Classification Search
USPC ................................ 118/500, 502, 503, 712
See application file for complete search history.

(56) References Cited

U.S. PATENT DOCUMENTS

| 5,698,070 A * | 12/1997 | Hirano | H01J 37/3244 |
| | | | 156/345.12 |
| 6,788,991 B2 * | 9/2004 | De Haas | H01L 21/67288 |
| | | | 700/121 |
| 11,024,526 B2 * | 6/2021 | Rebstock | H01L 21/67393 |
| 2008/0107509 A1 * | 5/2008 | Whitcomb | H01L 21/68707 |
| | | | 414/800 |
| 2017/0345702 A1 * | 11/2017 | Iwabuchi | H01L 21/6838 |

FOREIGN PATENT DOCUMENTS

| JP | H08-335622 A | 12/1996 | |
| WO | WO-2021179896 A1 * | 9/2021 | ....... H01L 21/67023 |

OTHER PUBLICATIONS

English Translation WO2021179896A1 (Year: 2021).*

* cited by examiner

*Primary Examiner* — Yewebdar T Tadesse
(74) *Attorney, Agent, or Firm* — Pearne & Gordon LLP (57) ABSTRACT

A substrate processing apparatus configured to process a substrate includes a functional component constituting a part of the substrate processing apparatus; a nozzle, provided on a surface of the functional component, allowing a gas to pass therethrough; a nozzle flow path which is connected to the nozzle of the functional component and through which the gas flows; a flow rate sensor configured to measure a flow rate of the gas flowing through the nozzle flow path; and a controller configured to make a determination upon a state of a distance between an interfering object and the functional component based on a measurement result obtained by the flow rate sensor.

15 Claims, 9 Drawing Sheets

SUBSTRATE PROCESSING APPARATUS, STATE DETERMINATION METHOD AND COMPUTER-READABLE RECORDING MEDIUM

CROSS-REFERENCE TO RELATED APPLICATION

This application claims the benefit of Japanese Patent Application No. 2020-173154 filed on Oct. 14, 2020, the entire disclosure of which is incorporated herein by reference.

TECHNICAL FIELD

The various aspects and embodiments described herein pertain generally to a substrate processing apparatus, a state determination method, and a computer-readable recording medium.

BACKGROUND

Patent Document 1 describes a substrate transfer device configured to transfer a substrate between a carrier and a wafer boat for supporting a plurality of substrates. This substrate transfer device is equipped with a transfer device main body, a fork, and electrostatic capacitance sensors. The transfer device main body is movable between a first moving/placing work position where it can perform a moving/placing operation to/from the wafer boat and a second moving/placing work position where it can perform a moving/placing operation to/from the carrier. The fork is configured to be capable of advancing to and retreating from the transfer device main body to transfer the substrate to/from the wafer boat and a substrate support of the carrier. The electrostatic capacitance sensors are mounted to both side portions of the fork and configured to advance or retreat as one body with the fork to detect a distance to the substrate and a position of the substrate within a horizontal plane.

Patent Document 1: Japanese Patent Laid-open Publication No. H08-335622

SUMMARY

In one exemplary embodiment, a substrate processing apparatus configured to process a substrate includes a functional component constituting a part of the substrate processing apparatus; a nozzle, provided on a surface of the functional component, allowing a gas to pass therethrough; a nozzle flow path which is connected to the nozzle of the functional component and through which the gas flows; a flow rate sensor configured to measure a flow rate of the gas flowing through the nozzle flow path; and a controller configured to make a determination upon a state of a distance between an interfering object and the functional component based on a measurement result obtained by the flow rate sensor.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Conventionally, in a manufacturing process for a semiconductor device or the like, various kinds of substrate processing apparatuses have been used. These substrate processing apparatuses include a coating and developing apparatus configured to perform a series of photolithography processes such as a resist coating process, an exposure process, and a developing process on a substrate such as a semiconductor wafer (hereinafter, referred to as "wafer"), an etching apparatus configured to perform an etching process on the wafer, and so forth.

In general, such a substrate processing apparatus is equipped with a transfer device configured to transfer the substrate. The transfer device has a fork as a substrate holder for holding the substrate, and the fork is configured to be movable. In this transfer device, by moving the fork with the substrate held thereon, the substrate can be transferred to a required position, for example.

However, when the fork is moved, it may come into contact with a substrate or structure nearby. For example, when the fork is inserted into a cassette accommodating a plurality of substrates therein to transfer the substrates, the fork may inadvertently come into contact with a substrate positioned below it. The transfer device is designed such that an unintentional contact does not occur. However, a positional deviation of the fork may occur due to, for example, a breakdown of a motor or a speed reducer or a change in a driving belt with a lapse of time in a driving system of the transfer device. If a sufficient distance between the fork and the substrate therebelow is not secured due to this positional deviation, the fork may vibrate greatly due to resonance frequency when the fork is moved at a high speed or the like, coming into contact with the substrate.

If the fork comes into contact with the substrate or structure nearby, the substrate or the structure may be damaged and particles may be generated, which is problematic. Further, if the fork comes into contact with the surroundings, it is necessary to appropriately cope with it by, for example, adjusting a movement condition of the fork, or by replacing or discarding the fork and the substrate or structure in contact with the fork. For the purpose, a method of detecting occurrence of a contact between the fork and the interfering object or an access of the fork to the interfering object, that is, a state determination method of making a determination upon the state of a distance between the fork and the interfering object which the fork can come into contact with is being considered.

As the state determination method, a method using, for example, an electrostatic capacitance sensor provided to the fork may be considered. In this method, a capacitance between a sensor unit of the electrostatic capacitance sensor and the interfering object which the fork may come into contact with (that is, the interfering object which may interfere with the fork) is measured, and it is determined based on the measurement result whether the contact between the fork and the interfering object has occurred. However, the capacitance between the sensor unit and the interfering object varies greatly depending on the properties of a material of the interfering object, such as conductivity or dielectric constant of the interfering object. As a result, in the aforementioned method using the electrostatic capacitance sensor, the determination upon the state of the distance between the fork and the interfering object may not be performed appropriately.

Besides the fork, any functional component constituting a part of the substrate processing apparatus may also suffer the aforementioned problems as long as the functional component is configured to be moved relatively with respect to another component of the substrate processing apparatus.

In view of the foregoing, exemplary embodiments provide a technique enabling to make an accurate determination upon the state of the distance between the functional component constituting a part of the substrate processing apparatus and the interfering object.

Hereinafter, a substrate processing apparatus and a state determination method according to an exemplary embodiment will be explained with reference to the accompanying drawings. In the present specification and the drawings, parts having substantially same functions and configurations will be assigned same reference numerals, and redundant description thereof will be omitted.

Figure 1:
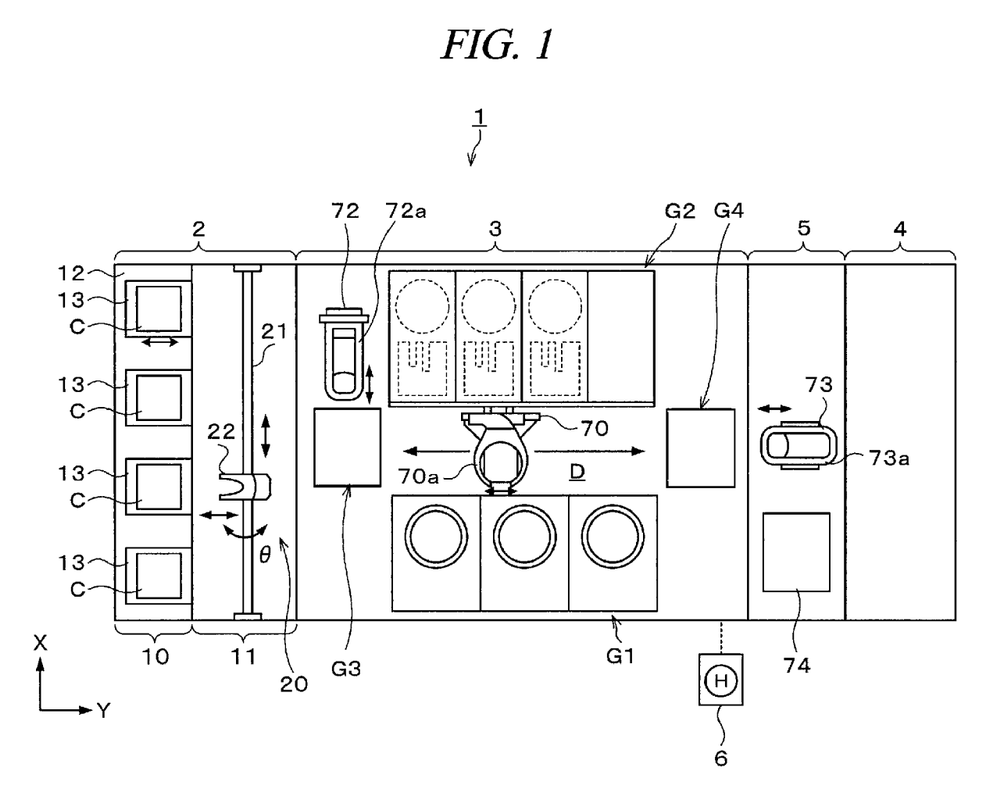
FIG. 1 is an explanatory diagram schematically illustrating an internal configuration of a wafer processing apparatus as a substrate processing apparatus according to an exemplary embodiment.
Figure 2:
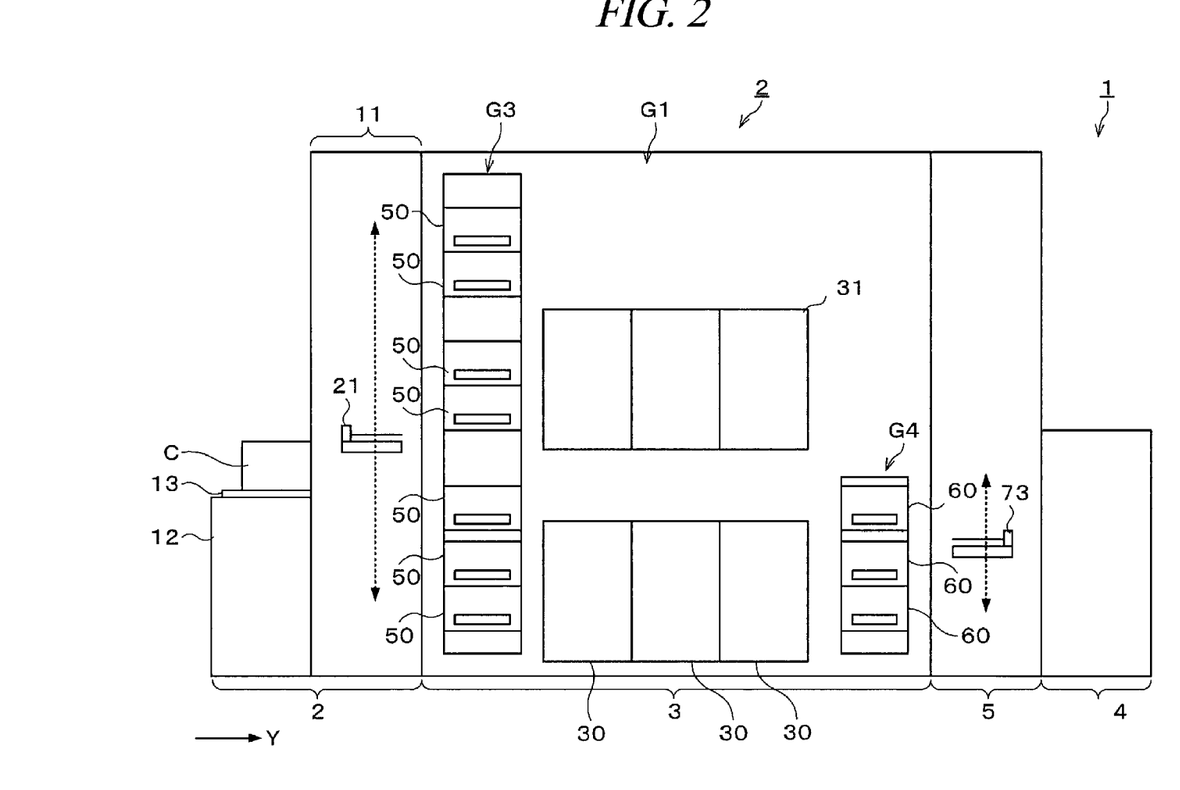
FIG. 2 is a diagram schematically illustrating the internal configuration of the wafer processing apparatus on a front side thereof.
Figure 3:
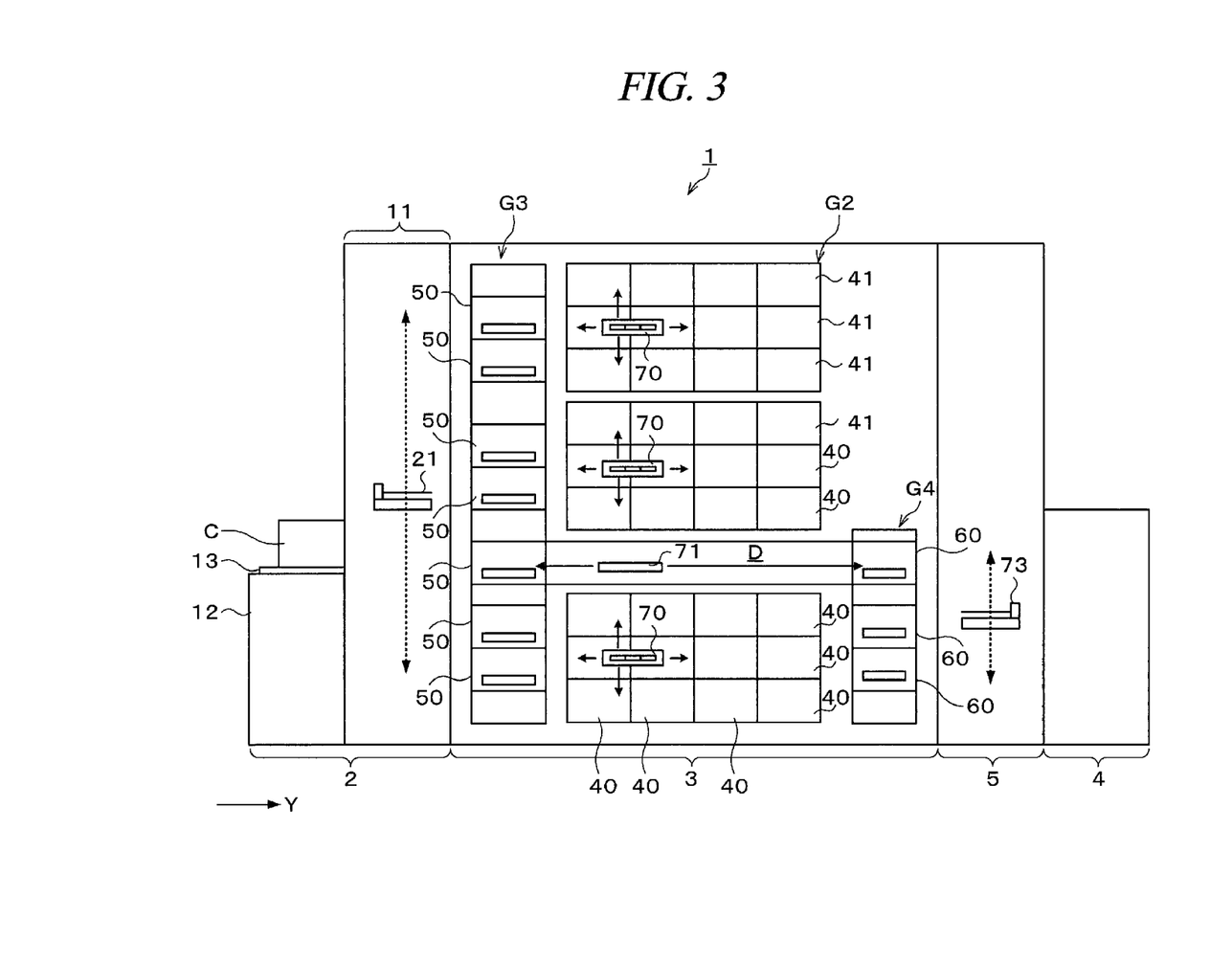
FIG. 3 is a diagram schematically illustrating the internal configuration of the wafer processing apparatus on a rear side thereof.

FIG. 1 is an explanatory diagram schematically illustrating an internal configuration of a wafer processing apparatus 1 as an example of the substrate processing apparatus according to the present exemplary embodiment. FIG. 2 and FIG. 3 are diagrams schematically illustrating the internal configuration of the wafer processing apparatus 1 on the front side and on the rear side thereof, respectively.

As shown in FIG. 1, the wafer processing apparatus 1 includes a cassette station 2 in which cassettes C, each of which is a container accommodating therein a plurality of wafers as substrates, are carried in and out; and a processing station 3 equipped with various kinds of processing units each configured to perform a preset process such as a resist coating process or a PEB process. The wafer processing apparatus 1 has a configuration in which the cassette station 2, the processing station 3, and an interface station 5 configured to transfer the wafer W to/from an exposure apparatus 4 adjacent to the processing station 3 are connected as one body. Further, the wafer processing apparatus 1 is equipped with a controller 6 configured to control the wafer processing apparatus 1.

The cassette station 2 is divided into, for example, a cassette carry-in/out section 10 and a wafer transfer section 11. By way of example, the cassette carry-in/out section 10 is provided at an end of the wafer processing apparatus 1 on the negative Y-axis side (left side in FIG. 1). The cassette carry-in/out section 10 is provided with a cassette placing table 12. On the cassette placing table 12, a plurality of, for example, four placing plates 13 are provided. The placing plates 13 are arranged in a row in the X-axis direction (up-and-down direction of FIG. 1) which is a horizontal direction. The cassettes C can be placed on these placing plates 13 when they are carried to/from the outside of the wafer processing apparatus 1.

The wafer transfer section 11 is equipped with a transfer device 20 configured to transfer the wafer W. The transfer device 20 is provided with a transfer path 21 extending in the X-axis direction; and a transfer unit 22 configured to be moved on the transfer path 21. The transfer unit 22 has a fork to be described later, which is movable in the Y-axis direction. The transfer unit 22 is also movable in a vertical direction and pivotable around a vertical axis (θ direction), and serves to transfer the wafers W between the cassette C on each placing plate 13 and a transit unit of a third block G3 of the processing station 3 to be described later. Details of the transfer unit 22 will be described later.

The processing station 3 is provided with a plurality of, for example, first to fourth four blocks G1, G2, G3 and G4 each of which is equipped with various units. For example, the first block G1 is provided on the front side of the processing station 3 (negative X-axis side in FIG. 1), and the second block G2 is provided on the rear side of the processing station 3 (positive X-axis side in FIG. 1). Further, the third block G3 is provided on the cassette station 2 side of the processing station 3 (negative Y-axis side in FIG. 1), and the fourth block G4 is provided on the interface station 5 side of the processing station 3 (positive Y-axis side in FIG. 1).

As illustrated in FIG. 2, a plurality of liquid processing units, for example, a developing unit 30 as a developing processing device configured to perform a developing process on the wafer W and a resist coating unit 31 configured to coat a resist liquid on the wafer W to form a resist film thereon are provided in the first block G1 in this sequence from below.

By way of example, three developing units 30 are horizontally arranged side by side, and three resist coating units 31 are horizontally arranged side by side. The number and the layout of the developing units 30 and the resist coating units 31 are not particularly limited and may be selected as required.

In each of the developing units 30 and the resist coating units 31, a preset processing liquid is coated on the wafer W by, for example, spin coating. In the spin coating, the processing liquid is discharged onto the wafer W from, for example, a discharge nozzle, and the wafer W is rotated, so that the processing liquid is diffused on the entire surface thereof.

For example, in the second block G2, as illustrated in FIG. 3, heat treatment units 40 each configured to perform a heat treatment such as heating or cooling of the wafer W and periphery exposure units 41 each configured to expose a peripheral portion of the wafer W to light are arranged vertically and horizontally. The number and the layout of the heat treatment units 40 and the periphery exposure units 41 may be selected as required. Further, a configuration of the heat treatment unit 40 will be described later.

The third block G3 is equipped with a multiple number of transit units 50. Further, the fourth block G4 is equipped with a plurality of transit units 60.

As depicted in FIG. 1, a wafer transfer area D is formed in a region surrounded by the first to fourth blocks G1 to G4. In the wafer transfer area D, a transfer device 70, for example, is disposed.

The transfer device 70 has a transfer arm 70a which is movable in, for example, the Y-axis direction, the forward-backward direction, the θ direction and the up-and-down direction. The transfer device 70 can transfer the wafer W into a preset unit within the first to fourth blocks G1 to G4 around it by moving the transfer arm 70a with the wafer W held thereon within the wafer transfer area D. As shown in FIG. 3, for example, a plurality of transfer devices 70 may be arranged vertically to transfer the wafers W to the preset units of the respective blocks G1 to G4 having the substantially same height.

Moreover, a shuttle transfer device 71 configured to transfer the wafer W linearly between the third block G3 and the fourth block G4 is provided in the wafer transfer area D.

The shuttle transfer device 71 moves the wafer W supported thereon linearly in the Y-axis direction to transfer the wafer W between the transit unit 50 of the third block G3 and the transit unit 60 of the fourth block G4 having the substantially same height.

As depicted in FIG. 1, a transfer device 72 is provided on the positive X-axis side of the third block G3. The transfer device 72 has a transfer arm 72a which is movable in, for example, the forward-backward direction, the θ direction and the up-and-down direction. The transfer device 72 can transfer the wafer W between the transit units 50 within the third block G3 by moving the transfer arm 72a holding the wafer W vertically.

The interface station 5 is provided with a transfer device 73 and a transit unit 74. The transfer device 73 has a transfer arm 73a which is movable in, for example, the Y-axis direction, the θ direction and the up-and-down direction.

The transfer device 73 holds the wafer W with the transfer arm 73a, and transfers the wafer W between the transit unit 60 within the fourth block G4, the transit unit 74 and the exposure apparatus 4.

The aforementioned controller 6 may be, for example, a computer including a CPU and a memory, and has a program storage (not shown). The program storage stores therein a program for controlling a wafer processing to be described later by controlling the aforementioned various kinds of processing units and a driving system such as the various kinds of transfer devices. Further, the program storage also stores therein a program for controlling a state determination processing to be described later. The programs may be recorded on a computer-readable recording medium H and installed from the recording medium H to the controller 6. A part or the whole of the programs may be implemented by dedicated hardware (circuit board).

Now, the wafer processing using the wafer processing apparatus 1 will be discussed.

In the wafer processing using the wafer processing apparatus 1, a wafer W is first taken out of the cassette C on the cassette placing table 12 and then transferred into one of the transit units 50 of the processing station 3 by the transfer unit 22.

Then, the wafer W is transferred by the transfer device 70 into one of the heat treatment units 40 of the second block G2 and subjected to a temperature control process. Then, the wafer W is transferred into one of the resist coating units 31 of the first block G1, and a resist film is formed on the wafer W. Thereafter, the wafer W is transferred into another heat treatment unit 40 to be subjected to a pre-bake (PAB: Pre-Applied Bake) process. In the pre-bake process and in a PEB process and a post-bake process of the next stage, the same heat treatment is performed. However, the heat treatment units 40 corresponding to the respective heat treatments are different.

Thereafter, the wafer W is transferred into one of the periphery exposure units 41 to be subjected to a peripheral exposure process. Then, the wafer W is transferred into the exposure apparatus 4 and subjected to an exposure process to have a preset pattern.

Subsequently, the wafer W is transferred into one of the heat treatment units 40 to be subjected to the PEB process. Then, the wafer W is transferred into, for example, one of the developing units 30 to be subjected to a developing process. Upon the completion of the developing process, the wafer W is transferred into the heat treatment unit 40 and subjected to the post-bake process. Thereafter, the wafer W is transferred onto the cassette C on the cassette placing table 12, and the series of photolithography processes are completed.

Figure 4:
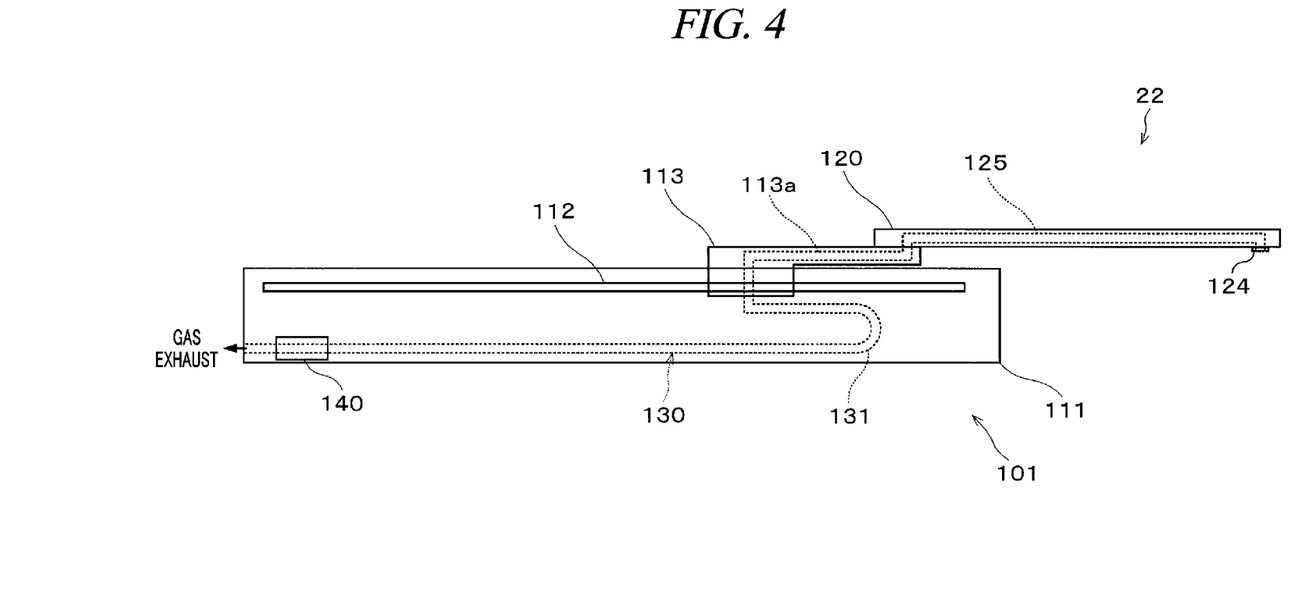
FIG. 4 is a side view schematically illustrating a configuration of a transfer unit.
Figure 5:
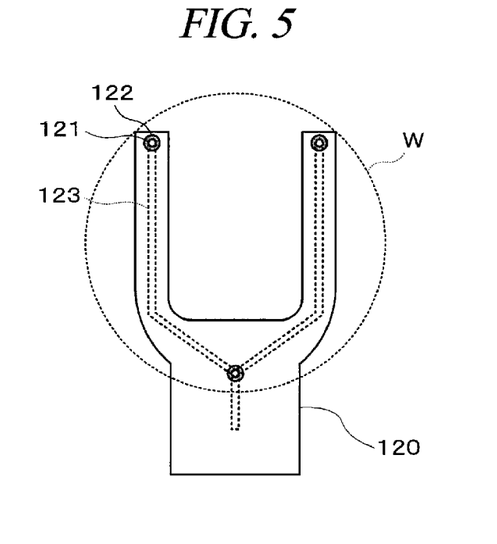
FIG. 5 is a top view schematically illustrating a configuration of a fork.
Figure 6:
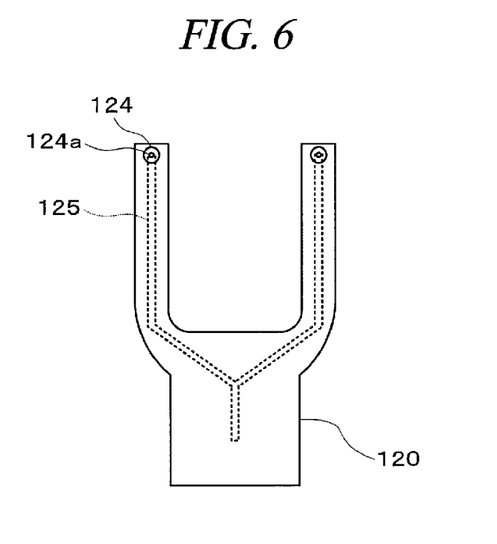
FIG. 6 is a bottom view schematically illustrating the configuration of the fork.
Figure 7:
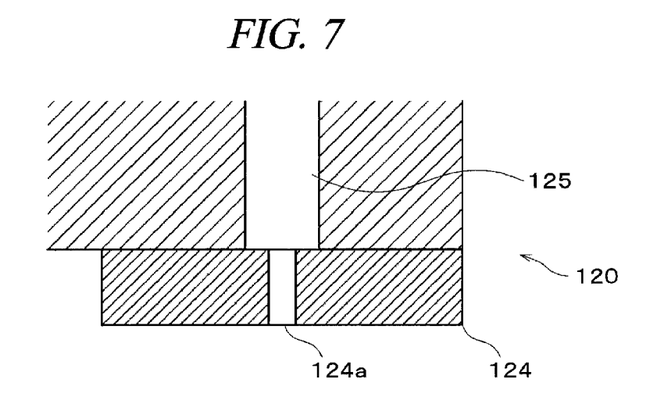
FIG. 7 is a cross sectional view schematically illustrating a configuration of a nozzle.

Now, the configuration of the aforementioned transfer unit 22 will be explained with reference to FIG. 4 to FIG. 7. FIG. 4 is a side view schematically illustrating the configuration of the transfer unit 22, and FIG. 5 and FIG. 6 are a top view and a bottom view respectively illustrating a schematic configuration of a fork to be described later. FIG. 7 is a cross sectional view schematically illustrating a configuration of a nozzle to be described later.

The transfer unit 22 has a base 101, as illustrated in FIG. 4. The base 101 supports a fork to be described later such that the fork is movable in the horizontal direction. The base 101 is configured to be movable along the transfer path 21 of FIG. 1 and to be able to move up and down by a driving force generated by a driving unit (not shown) having an actuator such as, but not limited to, a motor. In addition, the base 101 has a housing 111 of a rectangular cylinder shape with a hollow inside. Guide rails 112 extending in the horizontal direction are formed on both side surfaces of the housing 111. A mounting member 113 is attached to the guide rails 112.

The mounting member 113 is provided with a fork 120 configured as a substrate holder for holding the wafer W. The mounting member 113 is slidable along the guide rails 112 by a driving force generated by a driving unit (not shown) having an actuator such as, but not limited to, a motor. With this configuration, the fork 120 is movable in the horizontal direction. Specifically, the fork 120 can move to an initial position where the entire fork 120 is located at the outside of the cassette C when carrying the wafer W into or out of the cassette C, and then can move to a transfer position within the cassette C where the wafer W can be transferred with respect to the cassette C when carrying the wafer W into or out of the cassette C.

A leading end side of the fork 120 has, as shown in FIG. 5, a bifurcated shape with a width smaller than a diameter of the wafer W.

A plurality of (three in the shown example) attraction openings 121 are provided on a top surface of the fork 120, and attraction pads 122 are respectively disposed around the attraction openings 121. Further, a first internal flow path 123 is formed within the fork 120. A leading end of this first internal flow path 123 is branched into three, which are respectively connected to the attraction openings 121, and a base end of the first internal flow path 123 communicates with an exhaust mechanism (not shown). With this configuration, the fork 120 is capable of attracting and holding the wafer W through the attraction openings 121.

The first internal flow path 123 serves as an attraction flow path through which a gas from the attraction openings 121 flows when the attraction is performed. In FIG. 4 and FIG. 6, illustration of the first internal flow path 123 is omitted.

Moreover, a nozzle 124 is provided on a surface of the fork 120, specifically, on a bottom surface thereof, as shown in FIG. 6. The nozzle 124 is plural in number (two in this example), and one nozzle 124 is provided in each of different regions. Specifically, one nozzle 124 is provided on a bottom surface of each branched portion of the fork 120 on the leading end side thereof.

Each nozzle 124 extends downwards from the bottom surface of the fork 120, as depicted in FIG. 7. That is, the nozzle 124 is provided so as to extend toward the wafer W, which is an interfering object, when the wafer W is located under the fork 120. The nozzle 124 has a flow through hole 124a formed through the nozzle 124 from a leading end to a base end thereof (that is, vertically formed through the nozzle 124). A diameter of the flow through hole 124a is in the range from, e.g., 0.5 mm to 3 mm. In addition, the nozzle 124 is fixed to the fork 120 by, for example, adhesion.

The nozzle 124 is formed to have, for example, a cylindrical shape, as shown in FIG. 7. The diameter of the nozzle 124 is, for example, 5 mm to 10 mm, and the height thereof is, for example, 0.5 mm to 3 mm. For example, the nozzle 124 is made of the same material as the fork 120.

In addition, a second internal flow path 125 having a leading end connected to the nozzle 124 is formed inside the fork 120. Specifically, the leading end of the second internal flow path 125 is connected to the flow through hole 124a of the nozzle 124. The leading end side of the second internal flow path 125 is branched into two, and a leading end of each branched portion is connected to the flow through hole 124a. In the present exemplary embodiment, the first internal flow path 123 and the second internal flow path 125 are provided separately. Further, in FIG. 5, illustration of the second internal flow path 125 is omitted.

Further, as shown in FIG. 4, a relay flow path 113a having a leading end connected to a base end of the second internal flow path 125 is formed inside the mounting member 113.

Further, a pipeline 130 having a leading end connected to a base end of the relay flow path 113a is provided within the housing 111 of the base 101. A base end of the pipeline 130 is connected to an exhaust mechanism (not shown) configured to perform a gas exhaust at a preset exhaust pressure. With this configuration, a gas around the leading end of the nozzle 124 can be sucked into the nozzle 124 through the flow through hole 124a, and the gas from the flow through hole 124a passes through the second internal flow path 125, the relay flow path 113a and the pipeline 130 in this sequence and can be exhausted through the exhaust mechanism (not shown). The second internal flow path 125, the relay flow path 113a and the pipeline 130 constitute a nozzle flow path which is connected to the nozzle 124 and through which the gas flows.

Moreover, the pipeline 130 has a flexible portion 131 that can be transformed as the fork 120 is moved. Further, the pipeline 130 is provided with a flow rate sensor 140.

The flow rate sensor 140 is configured to measure a flow rate of the gas flowing in the pipeline 130. The flow rate sensor 140 is provided at a portion of the pipeline 130 opposite to the second internal flow path 125 with the flexible portion 131 therebetween.

In the present exemplary embodiment, the single flow rate sensor 140 is provided in common for the two flow through holes 124a.

A measurement result of the flow rate sensor 140 is outputted to the controller 6.

Further, the mounting member 113 and the fork 120 are made of, for example, aluminum. For example, a groove is formed by cutting an aluminum plate forming the exterior of the mounting member 113 and the fork 120. Then, by covering the opening side of the groove, the relay flow path 113a and the second internal flow path 125 are formed. Alternatively, the fork 120 may be made of a ceramic material.

The controller 6 makes, based on the measurement result of the flow rate sensor 140, a determination upon the state of a distance between the fork 120 and the wafer W therebelow as the interfering object, specifically, a determination upon the state of a distance between the bottom surface of the fork 120 and a top surface of the wafer W. The determination is, for example, to check whether the fork 120 and the wafer W therebelow are in contact with each other. In addition, the determination may be to check whether the fork 120 is approaching the wafer W therebelow. In the following example, it is determined whether the fork 120 and the wafer W therebelow are in contact with each other.

Further, the controller 6 makes the determination that the fork 120 and the wafer W therebelow are in contact with each other when the measurement result by the flow rate sensor 140 meets a preset condition.

Figure 8:
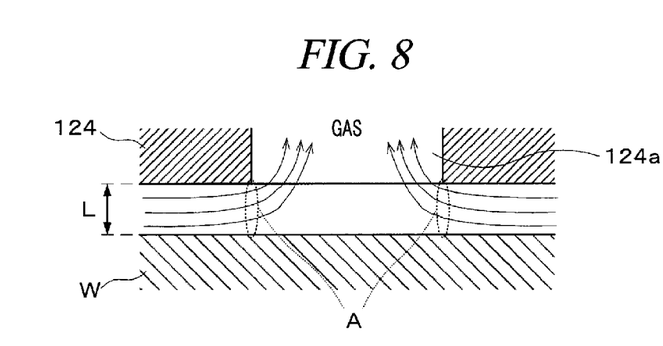
FIG. 8 is a diagram for explaining the reason why determination upon whether or not a fork and a wafer therebelow are in contact with each other is made based on a measurement result of a flow rate sensor.

The reason for determining whether the contact is made based on the measurement result of the flow rate sensor 140 as described above is as follows. That is, as shown in FIG. 8, a distance L between the flat leading end surface of the nozzle 124 and the top surface of the wafer W is proportional to an effective cross sectional area A for the gas which flows toward the flow through hole 124a. Further, when the gas is sucked from the flow through hole 124a at a predetermined exhaust pressure, the effective cross sectional area A and the flow rate of the gas heading toward the flow through hole 124a are roughly proportional when the nozzle 124 and the wafer W are closely located. Therefore, if the distance L between the flat leading end surface of the nozzle 124 and the top surface of the wafer W is short, the flow rate of the gas flowing toward the flow through hole 124a decreases, resulting in a decrease of the flow rate measured by the flow rate sensor 140 provided in the pipeline 130. If the distance L is long, on the other hand, the flow rate of the gas flowing toward the flow through hole 124a increases, and, as a result, the flow rate measured by the flow rate sensor 140 provided in the pipeline 130 also increases. That is, the flow rate measured by the flow rate sensor 140 varies depending on the distance L. This is the reason.

Figure 9:
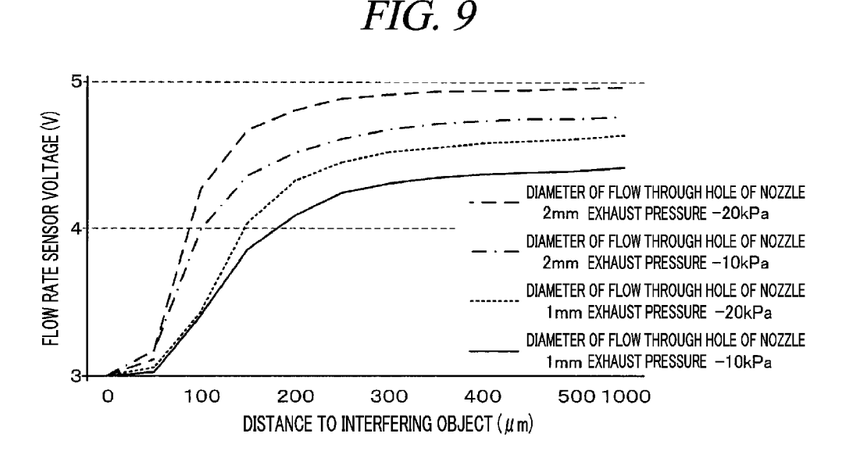
FIG. 9 is a diagram showing a relationship between a distance from a simulation fork equipped with a simulation nozzle to an interfering object, and an actual measurement result by the flow rate sensor.

FIG. 9 shows a relationship between a distance from a simulation fork equipped with a simulation nozzle to an interfering object and an actual measurement result by a flow rate sensor. The simulation nozzle has the same shape as the nozzle 124 having the flow through hole 124a, and the simulation fork has the same shape as the fork 120.

FIG. 9 presents measurement results obtained, in a configuration where one simulation nozzle is provided, by the flow rate sensor provided in a pipeline connecting the simulation nozzle and an exhaust mechanism when a gas is sucked at a regular exhaust pressure through a flow through hole formed in the simulation nozzle. A horizontal axis represents the distance from the simulation fork to the interfering object, and a vertical axis represents an output voltage of the flow rate sensor indicating the measurement result of the flow rate.

As can be clearly seen from FIG. 9, when the distance from the simulation nozzle to the interfering object is 200 μm or less, the output voltage of the flow rate sensor, that is, the flow rate measured by the flow rate sensor decreases as this distance becomes shorter, regardless of the diameter of the flow through hole of the simulation nozzle and the exhaust pressure. As can be seen from this result, it is possible to determine whether the fork 120 and the wafer W therebelow come into contact with each other based on the measurement result obtained by the flow rate sensor 140, as in the present exemplary embodiment.

Figure 10:
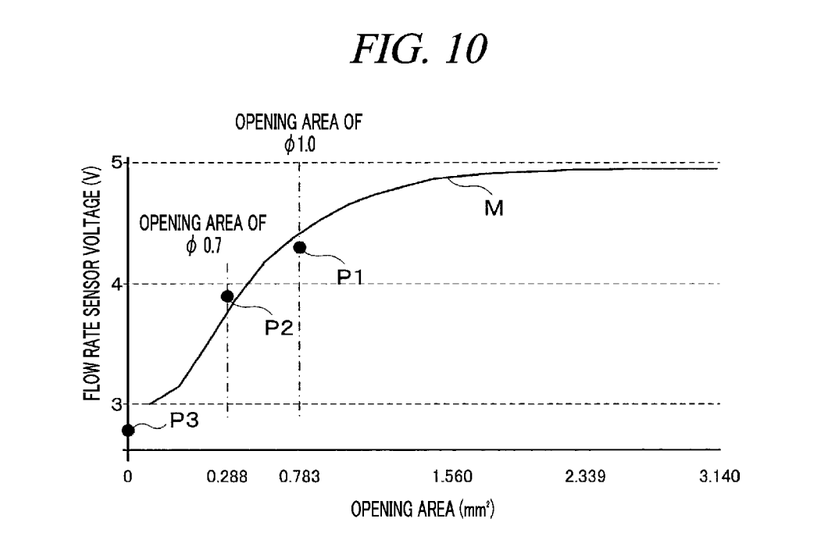
FIG. 10 is a diagram showing a relationship between an opening area of a flow through hole of the simulation nozzle, and the actual measurement result by the flow rate sensor.

FIG. 10 is a diagram showing a relationship between an opening area of the flow through hole of the simulation nozzle and an actual measurement result obtained by the flow rate sensor.

A horizontal axis of FIG. 10 represents the opening area of the flow through hole of the simulation nozzle, and a vertical axis thereof represents the output voltage of the flow rate sensor indicating the measurement result of the flow rate.

Further, a line M of FIG. 10 shows a result obtained when one simulation nozzle is provided and the flow through hole of this simulation nozzle is opened.

Points P1 to P3 in FIG. 10 show results obtained when two simulation nozzles are provided and a common flow rate sensor is provided in a pipeline in which leading ends of two passageways are respectively connected to the two simulation nozzles and base ends of these two passageways are joined, the same as in the present exemplary embodiment. More specifically, the point P1 shows a result when flow through holes of both simulation nozzles are opened; the point P2, a result when the flow through hole of one simulation nozzle is closed; and the point P3, a result when the flow through holes of both simulation nozzles are closed. Further, the diameter of the flow through hole of each simulation nozzle at the time of obtaining the results of the points P1 to P3 is 0.7 mm.

In addition, the exhaust pressure at the time of obtaining the results of FIG. 10 is −20 kPa.

Here, when the two simulation nozzles each having the flow through hole of 0.7 mm in diameter are provided, the total opening area of these flow through holes is substantially equal to an opening area of a flow through hole having a diameter of 1.0 mm when only one simulation nozzle is provided.

As indicated by the line M, when only one simulation nozzle is provided, if the exhaust pressure is set to be −20 kPa, the output voltage from the flow rate sensor varies (responds) linearly with respect to the opening area, in a range where the opening area of the flow through hole is smaller than that in case where the diameter of the flow through hole is 1 mm.

Further, as shown in FIG. 10, the output voltage from the common flow rate sensor when the two simulation nozzles each having the flow through hole of 0.7 mm in diameter are provided and both of these flow through holes are opened (point P1) is substantially equal to the output voltage from the flow rate sensor when the single simulation nozzle having the flow through hole of 1.0 mm in diameter is provided and the flow through hole is opened.

Also, the output voltage from the common flow rate sensor when the two simulation nozzles each having the flow through hole of 0.7 mm in diameter are provided and either one of these flow through holes are closed (point P2) is substantially equal to the output voltage from the flow rate sensor when the single simulation nozzle having the flow through hole of 0.7 mm in diameter is provided and the flow through hole is opened.

Furthermore, the output voltage from the common flow rate sensor when the two simulation nozzles each having the flow through hole of 0.7 mm in diameter are provided and both of these flow through holes are closed (point P3) is about zero.

As can be seen from this result, in case that the plurality of nozzles 124 are provided, if the exhaust pressure is set such that the output voltage from the common flow rate sensor 140 changes linearly with respect to the opening area of the flow through hole 124a within the range equal to or less than the total opening area of the flow through holes 124a, it can be determined whether or not each flow through hole 124a is closed. That is, as can be seen from the result of FIG. 10, if an appropriate exhaust pressure is set, the determination upon whether the fork 120 and the wafer W therebelow are in contact with each other can be made based on the measurement result of the flow rate sensor 140 when the plurality of nozzles 124 are provided at the fork 120 and the flow rate sensor 140 is provided at the pipeline 130 connecting the nozzles 124 and the exhaust mechanism, as in the present exemplary embodiment.

Next, the state determination processing of the wafer processing apparatus 1 will be explained. The following state determination processing is a determination processing regarding the state of the distance between the fork 120 and the wafer W located below the fork 120 in the cassette C. More specifically, the following state determination processing is a determination processing upon whether the fork 120 and the wafer W located below the fork 120 in the cassette C are in contact with each other. This state determination processing is performed, for example, during maintenance, at the start-up of the apparatus, or during production by the wafer processing apparatus 1, that is, during the operation of the apparatus.

<Acquisition of Determination Data>

First, the controller 6 starts the gas exhaust at a predetermined exhaust pressure by the exhaust mechanism connected to the nozzle 124, and moves the fork 120 with no wafer W held thereon from the aforementioned initial position to the aforementioned transfer position for the cassette C.

While the fork 120 is being moved as described above, the controller 6 acquires the measurement values of the flow rate continuously by the flow rate sensor 140 (output voltages from the flow rate sensor 140). That is, the controller 6 obtains time series data of the measurement values of the flow rate by the flow rate sensor 140 (hereinafter referred to as "determination target time series data regarding the fork 120") in a period during which the fork 120 is moving.

<Determination>

Then, the controller 6 determines whether the fork 120 and the wafer W therebelow are in contact with each other based on the determination target time series data regarding the fork 120. Specifically, the controller 6 determines whether or not the fork 120 is in contact with the wafer W in the cassette C while the fork 120 is moving. Further, when the determination target time series data regarding the fork 120 satisfies a predetermined condition (hereinafter referred to as "determination condition"), the controller 6 makes a determination that the fork 120 is in contact with the wafer W within the cassette C while the fork 120 is moving.

Hereinafter, specific examples of the determination condition will be described.

In the following determination conditions 1 to 5, reference time series data is used in the determination conditions 3 to 5, whereas the reference time series data is not used in the determination conditions 1 and 2. The reference time series data is time series data of the measurement values of the flow rate obtained by the flow rate sensor 140 while the fork 120 is moving, the same as the determination target time series data is obtained, and it is data in normal time when the contact between the fork 120 and the interfering object does not occur while the fork 120 is moving. Specifically, the reference time series data can be obtained in advance by, for example, moving the fork 120 back and forth into a space in which interference with the fork 120 cannot occur. Here, the space in which interference with the fork 120 cannot occur is, for example, a space within an empty cassette C disposed on the cassette placing table 12. Alternatively, a module having no structure provided therein may be provided additionally in the wafer processing apparatus 1, and a space in this module may be used as "the space in which interference with the fork 120 cannot occur." Further, the reference time series data may be acquired at the time of, for example, the start-up of the apparatus, or may be acquired periodically.

<Determination Condition 1>

The determination condition 1 is a condition that a measurement value by the flow rate sensor 140 or a differential value thereof (specifically, a time differential value) included in the determination target time series data regarding the fork 120 is less than a predetermined threshold.

<Determination Condition 2>

The determination condition 2 is a condition that a degree of variation at each time t, which is obtained by performing singular spectral transformation on the determination target time series data regarding the fork 120, exceeds a threshold.

Further, in the spectral transformation, partial time series data is obtained by using a slide window for the time series data. In addition, a test matrix is created by using the partial time series data around the time t, and a history matrix is created by using the partial time series data before the time t. Then, a difference of the test matrix from the history matrix is calculated as the degree of variation at the time t.

<Determination Condition 3>

The determination condition 3 is a condition using statistical values of the reference time series data.

To elaborate, the determination condition 3 is a condition that an average value μ and a deviation σ of the measurement values calculated in advance are used as the statistical values of the reference time series data. Further, it is a condition that a measurement value that fall outside the range of μ±3σ is included in the determination target time series data regarding the fork 120.

Alternatively, the determination condition 3 may be a condition that a mahalanobis distance of a measurement value included in the determination target time series data, which is calculated from the average value μ and the deviation σ of the measurement values in the reference time series data, exceeds a threshold.

In the determination condition 3, a differential value of the measurement value may be used instead of the measurement value, or both the measurement value and the differential value thereof may be used.

<Determination Condition 4>

The determination condition 4 is a condition that a degree of similarity of the determination target time series data to the closest reference time series data in time is less than a threshold. Further, the time series data of the measurement value of the flow rate by the flow rate sensor 140 can also be regarded as a waveform indicating a variation of the measurement value with a lapse of time.

The degree of similarity is calculated by using, for example, a dynamic time warping (DTW) method. In the dynamic time warping method, all distances between individual data of two time series data are first calculated, and the time series data are extended along a time axis such that the distance between the two time series data is minimized. The minimized distance becomes the degree of similarity.

By using the dynamic time warping method, when the data lengths of the reference time series data and the determination target time series data are different, or even when, in the reference time series data and the determination target time series data, a progress of the time variation (that is, the shape of the waveform) is similar but phases are different, the degree of similarity can be acquired more accurately.

<Determination Condition 5>

The determination condition 5 is a condition using a model obtained by performing machine learning based on multiple reference time series data.

As the model, an autoencoder, which is one of neural networks, may be used, for example. The autoencoder is a model for learning to represent, when input data is encoded and the encoded data is decoded, the original input data.

When normal time series data is inputted to the autoencoder that has learned the normal time series data, the time series data outputted from the autoencoder has few errors with respect to the inputted time series data. On the other hand, if abnormal time series data is inputted, the time series data outputted from the autoencoder has a large error with respect to the inputted time series data because the abnormal time series data cannot be represented in the autoencoder.

Therefore, in case of using the autoencoder as the model, a condition that the error of the time series data outputted by the autoencoder with respect to the time series data inputted to the autoencoder exceeds a threshold becomes the determination condition 5.

As described above, the wafer processing apparatus 1 according to the present embodiment includes the fork 120, the nozzle 124 provided on the bottom surface of the fork to allow the gas to pass therethrough, and the second internal flow path 125, the relay flow path 113a and the pipeline 130 serving as the nozzle flow path connected to the nozzle 124 to allow the gas to flow therethrough. Further, the wafer processing apparatus 1 is also equipped with the flow rate sensor 140 configured to measure the flow rate of the gas flowing through the nozzle flow path (specifically, the pipeline 130); and the controller configured to determine, based on the flow rate measured by the flow rate sensor 140, the state of the distance between the fork 120 and the wafer W positioned under the fork 120 within the cassette C, that is, the interfering object. The flow rate of the gas flowing in the pipeline 130, which is used for the determination, may not change largely due to the conductivity or the dielectric constant of the wafer W within the cassette C as the interfering object. Thus, according to the present exemplary embodiment, the determination upon the state of the distance between the fork 120 and the wafer W within the cassette C can be made accurately regardless of the conductivity or the dielectric constant of the wafer W.

In addition, as another method of determining whether or not the fork and the interfering object are in contact with each other, other than the above-described method according to the present exemplary embodiment, the following method may be considered. That is, a vibration sensor may be provided at the fork to detect a vibration generated when the fork and the interfering object come into contact with each other, and, based on this detection result from the vibration sensor, it may be determined whether the fork and the interfering object are in contact. In this method, however, if the fork is just vibrating without coming into contact with the interfering object, a wrong determination may be made. Using the above-stated determination conditions 2 to 5, however, the wrong determination may be hardly made even if the fork is vibrating without the contact.

Furthermore, in the present exemplary embodiment, the flow rate sensor 140 is provided at the portion of the pipeline 130 opposite to the second internal flow path 125 with the flexible portion 131 therebetween.

Accordingly, as compared to a case where the flow rate sensor 140 is provided near the second internal flow path 125 and the relay flow path 113a, it is easier to lay a signal line for the flow rate sensor 140, and, also, the flow rate sensor 140 itself is easy to install. Further, if the flexible portion 131 is present between the flow rate sensor 140 and the second internal flow path 125, in other words, if there is a bent portion at an upstream side of the flow rate sensor 140, a change in a pressure loss may occur at the bent portion, which may cause fluctuation of the flow rate, resulting in deterioration of a S/N ratio in the measurement result of the flow rate sensor 140. However, the present inventors have intensively investigated and found out that the S/N ratio is sufficiently higher than the flow rate caused by the fluctuation of the pressure loss. Thus, configuration as described above is still applicable.

Figure 11:
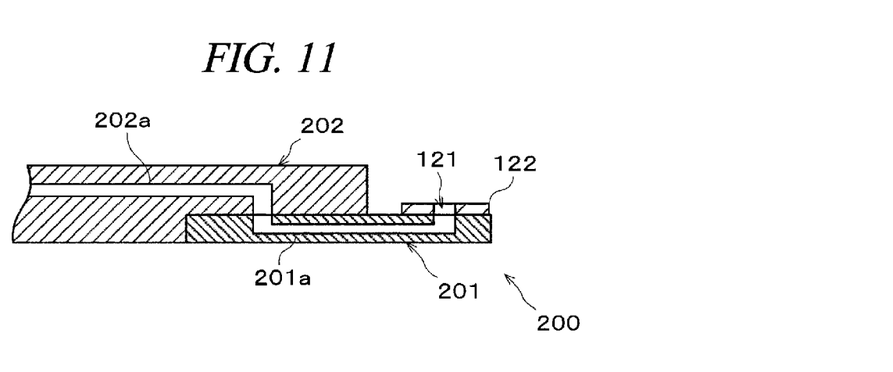
FIG. 11 is a diagram illustrating an example of an existing fork.
Figure 12:
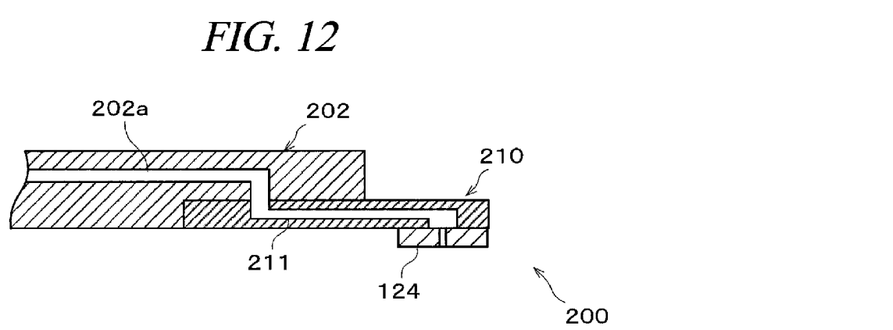
FIG. 12 is a diagram illustrating a state when a jig is attached to the existing fork of FIG. 11 instead of an attraction member.

Now, another example fork will be explained with reference to FIG. 11 and FIG. 12. FIG. 11 shows an example of an existing fork, and FIG. 12 is a diagram showing a state when a jig to be described later is attached to the existing fork of FIG. 11 instead of an attraction member to be described later.

As depicted in FIG. 11, an existing fork 200 has an attraction opening 121 and an attraction pad 122, the same as the fork 120 shown in FIG. 4, etc. Unlike the fork 120, however, the existing fork 200 does not have the nozzle 124 for use in the state determination.

The existing fork 200 specifically has an attraction member 201 and a fork main body 202. The exterior of the existing fork 202 has a shape substantially similar to that of the fork 120 shown in FIG. 5, etc., and a leading end side of the existing fork 200 has a bifurcated shape.

The attraction member 201 is detachably attached to the fork main body 202. Specifically, the attraction member 201 is detachably mounted to a bottom surface of the fork main body 202. Further, the attraction member 201 is fixed to the fork main body 202 by, for example, screwing. A top surface of the attraction member 201 on a leading end side thereof is not covered with the fork main body 202, and is provided with the attraction opening 121 opened upward. Moreover, the attraction pad 122 is provided on the top surface of the attraction member 201 on the leading end side thereof to cover a periphery of the attraction opening 121. Formed inside the attraction member 201 is a member-side internal flow path 201a having a leading end connected to the attraction opening 121 and serving to allow a gas to flow therethrough.

The fork main body 202 is provided with a body-side internal flow path 202a whose leading end is connected to the member-side internal flow path 201a and whose base end communicates with an exhaust mechanism (not shown). The member-side internal flow path 201a and the body-side internal flow path 202a constitute the first internal flow path 123 of the fork 120 shown in FIG. 4, etc. That is, the member-side internal flow path 201a and the body-side internal flow path 202a constitute the attraction flow path.

To make a determination regarding a state of a distance between the existing fork 200 and the wafer W located therebelow, the attraction member 201 is removed, and a jig 210 is installed instead, as shown in FIG. 12.

The jig 210 is detachably attached to the fork main body 202. Specifically, the jig 210 is detachably mounted to the bottom surface of the fork main body 202. A nozzle 124 is provided on a bottom surface of this jig 210. In addition, formed inside the jig 210 is a jig-side flow path 211 whose leading end is connected to the nozzle 124 and through which a gas flows. When this jig 210 is attached to the fork main body 202, the nozzle 124 communicates with the body-side internal flow path 202a through the jig-side internal flow path 211. Thus, the body-side internal flow path 202a and the jig-side flow path 211 together constitute the second internal flow path 125 of the fork 120 shown in FIG. 4, etc. That is, the body-side internal flow path 202a also serves as the nozzle flow path. Thus, by providing a flow rate sensor in a pipeline connecting an exhaust mechanism configured to perform a gas exhaust at a predetermined exhaust pressure and the body-side internal flow path 202a, and by using the jig 210, it is possible to make the determination upon the state of the distance between the existing fork 200 and the wafer W therebelow.

Moreover, when the four attraction members 201 are provided in total as stated above, the jig 210 is attached instead of the two attraction members 201 on the leading end side of the fork 200, for example. With the jig 210 attached, the attraction openings 121 of the attraction members 201 on the base end side of the fork 200 are closed when the determination is made.

Figure 13:
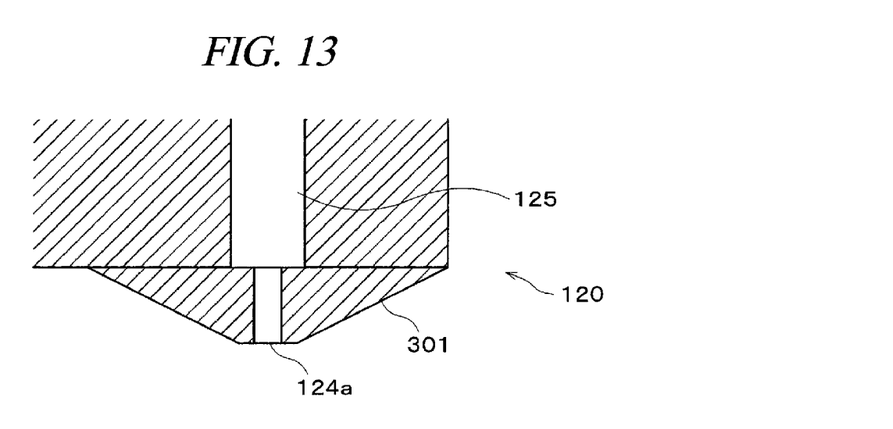
FIG. 13 is a diagram illustrating another example nozzle shape.

FIG. 13 is a diagram illustrating another example nozzle shape.

A nozzle 301 of FIG. 13 is of a conical shape which narrows from a base end toward a leading end thereof. By forming the nozzle 301 to have this shape, it is possible to make thick the base end side of the nozzle 301 while reducing an area of a leading end surface of the nozzle 301.

If the area of the leading end surface of the nozzle 301 is large, a force that attracts the gas may act on the wafer W and suck it up when the leading end surface of the nozzle 301 is located close to the top surface of the wafer W under the nozzle 301, that is, under the fork 120. In contrast, by reducing the area of the leading end surface of the nozzle 301, a region on the top surface of the wafer W where the force by which the nozzle 301 sucks the gas acts on becomes narrow. Accordingly, the total attracting force acting on the wafer W can be reduced. As a result, it may be possible to suppress the wafer W from being sucked up.

Further, by making thick the base end side of the nozzle 301, it is possible to suppress the nozzle 301 from being damaged when it comes into contact with the wafer W.

In the above-described exemplary embodiment, the determination is made regarding the state of the distance between the fork 120 (200) and the wafer W positioned therebelow. However, it may also be possible to make a determination upon a state of a distance between the fork 120 (200) and another member (for example, a structure within the cassette C) positioned therebelow.

Further, the nozzle 124 may be provided on the top surface of the fork to determine regarding a state of a distance between the fork and a member positioned thereabove, or the nozzle 124 may be provided on the front or side surface of the fork to make a determination regarding a state of a distance between the fork and a member (for example, an inner wall or a side wall of the cassette C) located in a space on the front or the side thereof.

In addition, although the nozzle 124 (301) is provided at the fork 120 of the transfer device 20, the same nozzle may be provided at another component (for example, the base 101) of the transfer device 20. Then, a determination upon the state of the distance between this another component of the transfer device and an interfering object may be made. Moreover, the same nozzle may be provided at another transfer device, such as the transfer device 70, and a determination upon the state of the distance between this other transfer device and an interfering object may be made.

Furthermore, the same nozzle may be provided in a member, other than the transfer device, which is configured to be moved relatively to another component, and a determination upon the state of the distance between this member and an interfering object may be made.

Figure 14:
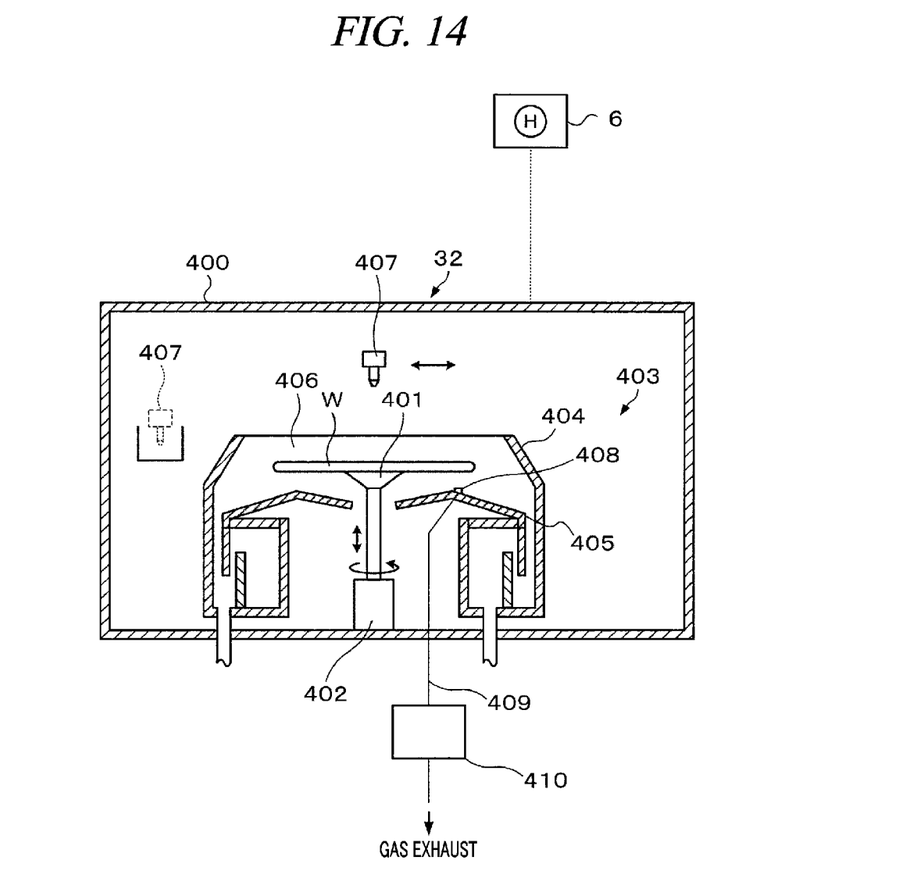
FIG. 14 is a diagram illustrating an example where the nozzle is provided within a resist coating unit.

FIG. 14 is a diagram illustrating an example where the nozzle is provided within the resist coating unit 32.

The resist coating unit 32 is equipped with, as illustrated in FIG. 14, a processing vessel 400 having a sealable inside. A carry-in/out opening (not shown) for the wafer W is provided at a side surface of the processing vessel 400.

A spin chuck 401 configured to hold the wafer W is provided within the processing vessel 400. The spin chuck 401 is capable of rotating the wafer W held thereon. The spin chuck 401 may be rotated at a preset speed by a chuck driving unit 402 having an actuator such as, but not limited to, a motor. In addition, the chuck driving unit 402 is provided with an elevating mechanism such as, but not limited to, a cylinder, and the spin chuck 401 is configured to be moved up and down.

Further, in the processing vessel 400, a cup 403 as a surrounding member is disposed at the outside of the spin chuck 401 to surround the wafer W held by the spin chuck 401. The cup 403 includes an outer cup 404 that receives and collects a liquid scattered or falling from the wafer W; and an inner cup 405 positioned inside the outer cup 404. An opening 406 through which the wafer W passes before and after the transfer of the wafer W onto the spin chuck 401 is formed at the top of the outer cup 404.

Moreover, a discharge nozzle 407 configured to discharge a resist liquid onto the wafer W is provided within the processing vessel 400 to be movable vertically and horizontally.

In this resist coating unit 32, a nozzle 408 which is identical to the above-described nozzle 124 is provided on a surface of the cup 403 to determine the state of the distance between the cup 403 and the wafer W held by the spin chuck 401, specifically, the state of the distance between the wafer W and the inner cup 405. To be more specific, the nozzle 408 is provided on a top surface of the inner cup 405.

The resist coating unit 32 is equipped with a pipeline 409 constituting a passageway which is connected to the nozzle 408 and through which a gas flows. An exhaust mechanism configured to perform a gas exhaust at a predetermined exhaust pressure and the nozzle 408 communicate with each other through this pipeline 409. Accordingly, it is possible to suck the gas around a leading end of the nozzle 408 from a flow through hole of the nozzle 408 into the nozzle 408. The pipeline 409 is provided with a flow rate sensor 410.

In this example, the determination on the state of the distance between the wafer W held by the spin chuck 401 and the inner cup 405 located therebelow is made based on the measurement result by the flow rate sensor 410. Therefore, regardless of the conductivity or the dielectric constant of the inner cup 405, the above determination can be made accurately.

Further, in the above-described exemplary embodiment, the state determination is made during the maintenance. However, when using the fork 120 shown in FIG. 4, etc., for example, the state determination may be made constantly during the aforementioned wafer processing or the like.

Additionally, in the above-described exemplary embodiment, the gas around the leading end of the nozzle 124 (301, 408) is sucked in at a predetermined exhaust pressure through the nozzle 124 (301, 408). Instead, however, the gas may be discharged from a leading end of a nozzle for state determination. For example, in case that the nozzle for state determination is provided on the surface of the cup 403, such as the inner cup 405, there may be set up a configuration in which the gas is discharged from the leading end of this nozzle. With this configuration, it is possible to suppress a processing liquid such as a resist liquid along with the gas from being sucked in from the nozzle.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to accurately determine the state of the distance between the functional component constituting a part of the substrate processing apparatus and the interfering object.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus configured to process a substrate, comprising:
a functional component constituting a part of the substrate processing apparatus;
a nozzle, provided on a surface of the functional component, allowing a gas to pass therethrough;
a nozzle flow path which is connected to the nozzle of the functional component and through which the gas flows;
a flow rate sensor configured to measure a flow rate of the gas flowing through the nozzle flow path; and
a controller configured to make a determination as to a state of a distance between an interfering object and the functional component based on a measurement result obtained by the flow rate sensor,
wherein the functional component is a substrate holder of a transfer device configured to transfer the substrate, and
the nozzle is provided on a surface of the substrate holder,
wherein the controller determines, as the determination, whether or not the interfering object and the substrate holder are in contact with each other, and
the controller determines that the interfering object and the substrate holder are in contact with each other when the measurement result of the flow rate sensor meets a preset condition.

2. The substrate processing apparatus of claim 1,
wherein the substrate holder is configured to attract and hold the substrate through an attraction opening, and
an attraction flow path, which is connected to the attraction opening and through which the gas flows when attraction is performed, and the nozzle flow path are provided individually within the substrate holder.

3. The substrate processing apparatus of claim 1,
wherein the substrate holder is configured to attract and hold the substrate through an attraction opening,
an attraction flow path, which is connected to the attraction opening and through which the gas flows when attraction is performed, is provided within the substrate holder,
the nozzle is provided at a jig which is allowed to be attached to and detached from the substrate holder,
the nozzle is connected to the attraction flow path when the jig is mounted to the substrate holder, and
the attraction flow path also serves as the nozzle flow path.

4. The substrate processing apparatus of claim 1,
wherein the transfer device comprises:
a base supporting the substrate holder such that the substrate holder is allowed to be moved;
an internal flow path constituting the nozzle flow path within the substrate holder; and
a pipeline, connected to the internal flow path, constituting the nozzle flow path within the base,
wherein the pipeline has a flexible portion that is allowed to be transformed when the substrate holder is moved, and
the flow rate sensor is provided at a portion of the pipeline opposite to the internal flow path with the flexible portion therebetween.

5. The substrate processing apparatus of claim 1,
wherein the nozzle has a conical shape that narrows from a base end toward a leading end thereof.

6. The substrate processing apparatus of claim 1,
wherein the present condition is a condition that a measurement value of the flow rate sensor is less than a threshold.

7. The substrate processing apparatus of claim 1,
wherein the preset condition is a condition that a degree of variation obtained by performing singular spectral transformation on time series data of a measurement value of the flow rate sensor exceeds a threshold.

8. The substrate processing apparatus of claim 1,
wherein the preset condition is a condition using reference time series data as time series data of a measurement value of the flow rate sensor in normal time and determination target time series data of the measurement value of the flow rate sensor as a determination target.

9. The substrate processing apparatus of claim 8,
wherein the preset condition is a condition that a degree of similarity of the determination target time series data with respect to a closest reference time series data falls below a threshold.

10. The substrate processing apparatus of claim 9,
wherein the degree of similarity is calculated by using dynamic time warping method.

11. The substrate processing apparatus of claim 8,
wherein the preset condition is a condition using a model obtained by performing mechanical learning based on the reference time series data.

12. The substrate processing apparatus of claim 11,
wherein the model is an autoencoder.

13. The substrate processing apparatus of claim 8,
wherein the reference time series data is time series data of the measurement value of the flow rate sensor obtained when the functional component is operated in a state where no interfering object exists.

14. The substrate processing apparatus of claim 1,
wherein the nozzle includes multiple nozzles, and the multiple nozzles are respectively provided at different regions on the surface of the functional component, and
the controller makes the determination based on the common flow rate sensor connected to the multiple nozzles.

15. A substrate processing apparatus configured to process a substrate, comprising:
a functional component constituting a part of the substrate processing apparatus;
a nozzle, provided on a surface of the functional component, allowing a gas to pass therethrough;
a nozzle flow path which is connected to the nozzle of the functional component and through which the gas flows;
a flow rate sensor configured to measure a flow rate of the gas flowing through the nozzle flow path; and
a controller configured to make a determination as to a state of a distance between an interfering object and the functional component based on a measurement result obtained by the flow rate sensor,
wherein the functional component is a surrounding member disposed within a substrate processing unit configured to process the substrate while holding the substrate, and configured to surround the substrate when the substrate is processed, and
the nozzle is provided on a surface of the surrounding member, wherein the controller determines, as the determination, whether or not the interfering object and the surrounding member are in contact with each other, and the controller determines that the interfering object and the surrounding member are in contact with each other when the measurement result of the flow rate sensor meets a preset condition.

\* \* \* \* \*